United States Patent [19]

Lim et al.

[11] Patent Number: 5,465,004
[45] Date of Patent: Nov. 7, 1995

[54] PROGRAMMABLE SEMICONDUCTOR INTEGRATED CIRCUITS HAVING FUSIBLE LINKS

[75] Inventors: Sheldon C. P. Lim, Sunnyvale; Julie W. Hellstrom, Santa Clara; Ting P. Yen, Fremont, all of Calif.

[73] Assignee: North American Philips Corporation, New York, N.Y.

[21] Appl. No.: 400,776

[22] Filed: Mar. 6, 1995

Related U.S. Application Data

[63] Continuation of Ser. No. 151,590, Nov. 12, 1993, abandoned, which is a continuation of Ser. No. 654,844, Feb. 11, 1991, abandoned, which is a division of Ser. No. 395,926, Aug. 18, 1989, Pat. No. 5,015,604.

[51] Int. Cl.[6] .................................. H01L 29/12; H01L 27/02
[52] U.S. Cl. ........................ 257/529; 257/173; 257/665; 257/904
[58] Field of Search .......................... 357/51, 71, 23.7, 357/67, 54, 67, 68, 71, 45; 437/103; 257/173, 529, 665, 904

[56] References Cited

U.S. PATENT DOCUMENTS

| | | | |
|---|---|---|---|
| 3,380,156 | 4/1968 | Lood et al. | 427/103 |
| 4,491,860 | 1/1985 | Lim | 357/68 |
| 4,796,075 | 1/1989 | Whitten | 357/51 |
| 5,017,510 | 5/1991 | Welch et al. | 357/71 |
| 5,025,300 | 6/1991 | Billig et al. | 357/51 |

FOREIGN PATENT DOCUMENTS 59-54240  3/1984  Japan.

*Primary Examiner*—Jerome Jackson
*Assistant Examiner*—Carl Whitehead, Jr.
*Attorney, Agent, or Firm*—Michael J. Balconi-Lamica

[57] ABSTRACT

The size of a fusible link (22 $C_F$) created from part of a metal layer (22) is controlled by an oxidation performed in a deposition chamber that is also used for depositing a dielectric layer (30) over the fuse structure. The metal layer serves as a diffusion barrier between semiconductor material (14 and 16) and another metal layer (24).

8 Claims, 3 Drawing Sheets

1

PROGRAMMABLE SEMICONDUCTOR INTEGRATED CIRCUITS HAVING FUSIBLE LINKS

This is a continuation of application Ser. No. 08/151,590, filed on Nov. 12, 1993 now abandoned, which is a continuation of application Ser. No. 07/654,844, filed on Feb. 11, 1991, now abandoned which is a divisional of application Ser. No. 07/395,926, filed on Aug. 18, 1989, now U.S. Pat. No. 5,015,604.

FIELD OF USE

This invention relates to fusible links (or fuses) suitable for use in programmable semiconductor integrated circuits.

BACKGROUND ART

Fusible links are employed in integrated circuits to create programmable elements. To reduce the number of processing steps needed to fabricate a programmable integrated circuit, the material used to make fuses often serves other purposes in the circuit. For example, U.S. Pat. No. 4,491,860 describes a programmable memory in which a patterned layer of titanium-tungsten nitride provides fusible links and also functions as a barrier metal between semiconductor material and another metal in the electrical interconnection system for the memory.

In U.S. Pat. No. 4,491,860, the starting point for defining a fusible link is a monocrystalline silicon semiconductor body having a dielectric layer along its upper surface. Several apertures extend through the dielectric layer down to the silicon. Thin metal silicide films lie along the silicon at the bottoms of some of the apertures.

A blanket layer of titanium-tungsten nitride (approximate formula $TiW_2N$) is deposited on the dielectric layer and into the apertures down to the silicon or metal silicide. The $TiW_2N$ layer is patterned so as to leave a main portion of the titanium-tungsten nitride in an elongated lateral shape consisting of a pair of end sections and an intermediate section extending between the end sections. The intermediate $TiW_2N$ section, which reaches a width much less than that of either end section, constitutes the fusible link. Other $TiW_2N$ portions remain in the apertures having the metal silicide films.

A first electrical interconnect layer is created by depositing a blanket layer of aluminum on the upper surface of the structure and patterning the aluminum to remove selected parts, including all the aluminum on the $TiW_2N$ fusible link. Aluminum remains on both $TiW_2N$ sections at the ends of the fuse. Aluminum also remains on the $TiW_2N$ portions in the apertures having the metal silicide films. The titanium-tungsten nitride in these apertures acts as a diffusion barrier to prevent the aluminum and silicon from intermixing.

A second dielectric layer is deposited on the upper surface of the structure. Apertures are then etched through the second dielectric layer down to selected parts of the patterned first aluminum. The basic interconnection system for the memory is completed by providing the structure with a patterned second aluminum layer that lies on the second dielectric layer and extends through the apertures in it down to the first aluminum.

To program the memory element containing the fuse, a suitable high voltage is applied between the $TiW_2N$ sections at the ends of the fuse. This creates an open circuit by causing the fusible link to melt (at the narrowest cross-section).

One difficulty with using the same material for both the fuse and barrier metal, as in U.S. Pat. No. 4,491,860, is that the fuse and barrier metal have certain opposing requirements. The barrier metal effectiveness is compromised if the metal is too thin. On the other hand, the fuse blows easier when there is less metal to melt.

Given an acceptable minimum barrier metal thickness (e.g., 1,000 angstroms), one way of approaching the problem is to make the fuse quite narrow. That is, the "width" of the fuse in the lateral direction perpendicular to the current flow should be made small. However, with conventional photolithographic/etching equipment of reasonable cost, the minimum achievable width is approximately 1 micron with a fairly wide variation. This frequently results in a fuse resistance that is too low. Consequently, the programming yield is poor.

The fuse resistance can be controlled by performing an oxidation on the fuse after it has been photolithographically defined and etched. See published Japanese patent application 59-54240. The oxidation reduces both the width and thickness of the fuse, thereby increasing its resistance.

A disadvantage of the foregoing Japanese application is that a buffer metal is used between the fuse metal and the overlying interconnect layer. The buffer metal is patterned at the same time as the interconnect layer and then, after the oxidation, is etched further to reduce the lateral area. The use and further etching of the buffer metal increase the fabrication time and expense.

GENERAL DISCLOSURE OF THE INVENTION

The present invention centers around a time-efficient, cost-effective technique involving the use of oxidation to control the size of a fusible link created from a metal layer that can also serve as a barrier metal.

In manufacturing a structure according to the teachings of the invention, a patterned layer of barrier metal and a patterned layer of primary metal are provided over a first dielectric layer located along a surface of a main body. The patterned barrier metal layer lies directly on the dielectric layer. The fuse is formed from a main portion of the barrier metal having a pair of end sections and a fusible intermediate section that extends between the end sections. Part of the patterned primary metal layer lies on at least one of the end sections but not on the intermediate section. The primary metal layer typically later serves as an electrical interconnect layer.

One or more apertures preferably extend through the dielectric layer down to semiconductor material of the main body. In forming the two patterned metal layers, the barrier metal is introduced into each aperture, and part of the primary metal is formed on the barrier metal located in at least one aperture. The barrier metal layer consists principally of refractory metal that prevents semiconductor material along each aperture from mixing with overlying primary metal.

After placing the structure in a deposition chamber, barrier metal oxide is grown along the exposed area of the barrier metal layer by oxidizing the exposed material to a prescribed depth. The oxidation thins (and narrows) the intermediate section of the main barrier metal portion so as to increase the fuse resistance. Without removing the structure from the deposition chamber, a second dielectric layer is deposited on the barrier metal oxide and over the remaining primary metal. Because the oxidation and deposition steps are performed in this manner, the throughput is high. In the final structure, the fuse consists of the remainder of the intermediate section.

The fuse resistance is controlled without using a buffer metal such as that described in Japanese application 59-54240. The present invention thereby avoids the extra processing employed in the Japanese application. This enables the invention to achieve significant time and cost savings. Since the fuse characteristics in the invention can be readily optimized without damaging the barrier metal properties, the invention provides a material advance over the prior art.

BRIEF DESCRIPTION OF THE DRAWINGS

Like reference symbols are employed in the drawings and in the description of the preferred embodiments to represent the same or very similar item or items.

DESCRIPTION OF THE PREFERRED EMBODIMENTS

Figure 1A:
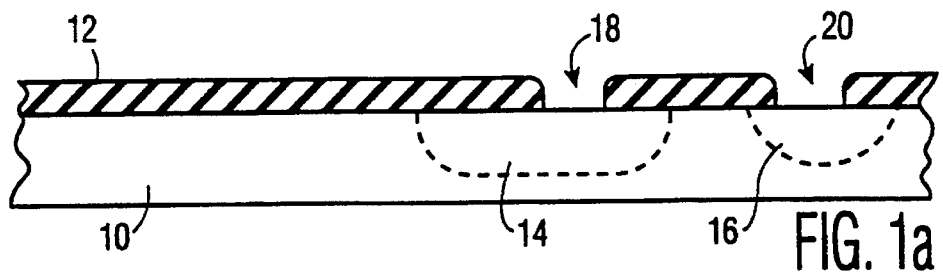
FIGS. 1a, 1b, 1c, 1d, 1e, 1f, 1g, 1h, and 1i are cross-sectional structural side views representing steps in manufacturing a programmable semiconductor structure according to the invention.

Referring to the drawings, FIGS. 1a–1i illustrate how a programmable semiconductor structure containing a patterned metal layer that functions as both a fusible link and a barrier metal is fabricated in accordance with the invention. Conventional cleaning and photoresist masking techniques are employed in the fabrication process. References to the cleaning steps, to the steps involved in making the photoresist masks, and to other such well-known semiconductor processing steps are omitted from the following discussion to simplify the description. All composition percentages given below are in weight percent.

The starting point for the invention is a partially processed semiconductor wafer consisting of a main body 10 and a dielectric layer 12 located along the upper surface of body 10. See FIG. 1a. As used in this description, the terms "upper", "lower", "top", "bottom", "above", "below", "lateral", and the like are defined (for convenience) with respect to the orientation of body 10 when its generally flat lower surface is parallel to the ground.

Main body 10 is a monocrystalline silicon semiconductor structure divided into various N-type and P-type regions (not shown). A typical embodiment for body 10 is the monocrystalline silicon substrate and overlying silicon epitaxial layer described in U.S. Pat. No. 4,491,860, the contents of which are incorporated by reference herein. Body 10 may also include various dielectric regions. For example, body 10 might consist of a monocrystalline silicon structure, an overlying patterned dielectric film, and a patterned polycrystalline silicon layer on the dielectric film. Dielectric layer 12 preferably consists of silicon dioxide having a thickness of 1–1.5 microns.

At the minimum, body 10 contains a pair of silicon portions 14 and 16 (shown in dashed line). Silicon portions 14 and 16 extend to the upper surface of body 10. Apertures 18 and 20 extend through dielectric layer 12 down to portions 14 and 16.

Figure 1B:
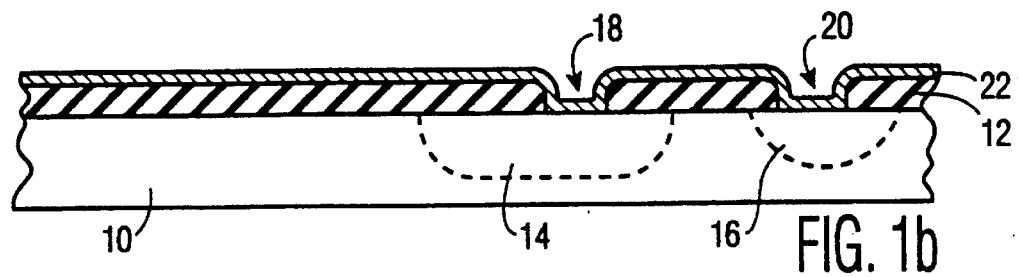
Figure 1C:
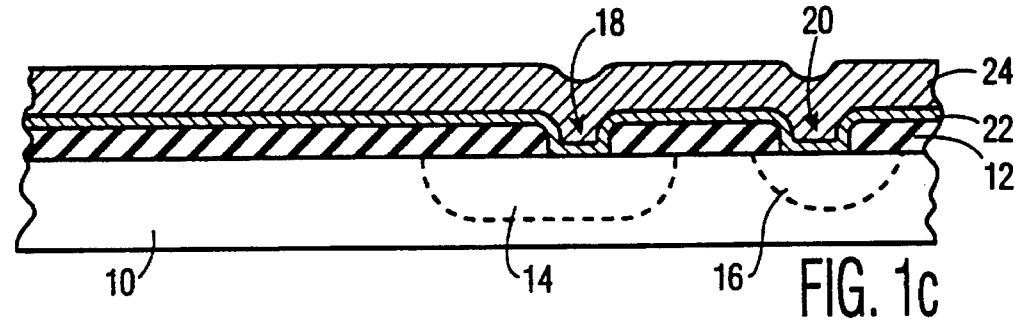

A largely homogeneous blanket layer 22 of barrier metal is deposited on layer 12 and into apertures 18 and 20 as shown in FIG. 1b. The barrier metal consists of refractory metal that acts as a diffusion barrier between silicon and aluminum. Part of barrier metal layer 22 later serves as the fusible link. Layer 22 is preferably created by sputtering titanium-tungsten to a thickness of 1,000±100 angstroms without applied heat from a target consisting of approximately 15% titanium and 85% tungsten. At the end of the sputter deposition, layer 22 consists of approximately 12% titanium and 88% tungsten. Layer 22 could be formed at other Ti/W percentages going all the way from 0% Ti/100% W to 100% Ti/0% W. Other refractory metals could also be used to create layer 22.

A largely homogeneous primary metal layer 24, part of which later serves as a first interconnect layer, is blanket deposited on barrier metal layer 22 according to a conventional sputtering technique. See FIG. 1c. Layer 24 consists of aluminum with up to 4% copper and up to 2% silicon. Layer 24 is preferably formed with aluminum and 1% copper to a thickness of 6,750±750 angstroms. The sputter deposition may be done at elevated temperature to improve step coverage. Alternatively, chemical vapor deposition or other physical deposition techniques could be employed without adverse effect.

Figure 1D:
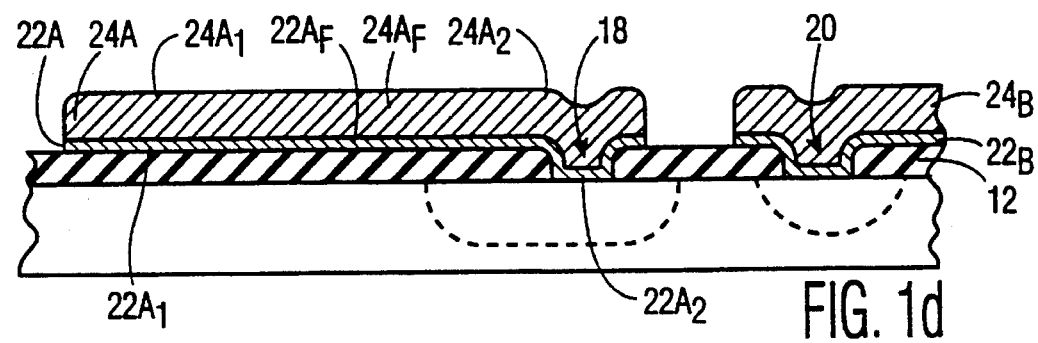

Using a suitable photoresist mask (not shown), selected parts of blanket layers 22 and 24 are removed down to dielectric layer 12 with a conventional dry etchant such as a plasma containing chlorine and a small amount of fluorine. Conventional wet etchants could also be used. FIG. 1d shows the structure after removal of the photoresist.

Items 22A and 22B in FIG. 1d are portions of the resulting patterned barrier metal layer. Overlying items 24A and 24B are portions of the resulting patterned primary metal layer. The selective etching is done in such a way that metal portion 22A consists of a pair of end sections $22A_1$ and $22A_2$ and a fusible intermediate section $22A_F$ extending between end sections $22A_1$ and $22A_2$. Intermediate section $22A_F$ is destined to become the fuse. Metal portion 24A is similarly divided into a pair of end sections $24A_1$ and $24A_2$ and an intermediate section $24A_F$.

Figure 2A:
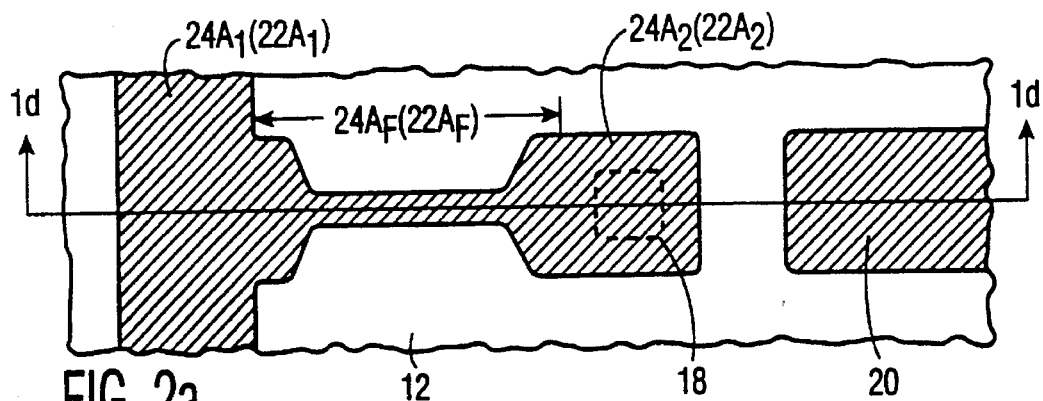
FIGS. 2a, 2b, 2c, and 2d are top views of the structural stages shown in FIGS. 1d–1f and 1i, respectively. These figures are taken respectively through planes 1d—1d, 1e—1e, 1f—1f, and 1i—1i in FIGS. 2a–2d. For convenience, the various metallic and dielectric regions in FIGS. 2a–2d are illustrated using the same shading as the corresponding regions in FIGS. 1d–1f and 1i.

FIG. 2a illustrates the shape of the patterned barrier metal and primary metal layers. End sections $22A_1$ and $24A_1$ form a conductive line having a bulge where they meet intermediate sections $22A_F$ and $24A_F$. End sections $22A_2$ and $24A_2$ lie over and extend into aperture 18. The width of intermediate section $22A_F$ (and intermediate section $24A_F$) at the narrowest cross-section is typically 1 micron. This is considerably less than the minimum width of end sections $22A_1$ and $22A_2$ (and end sections $24A_1$ and $24A_2$). Portions 22B and 24B lie over and extend into aperture 20.

Figure 1E:
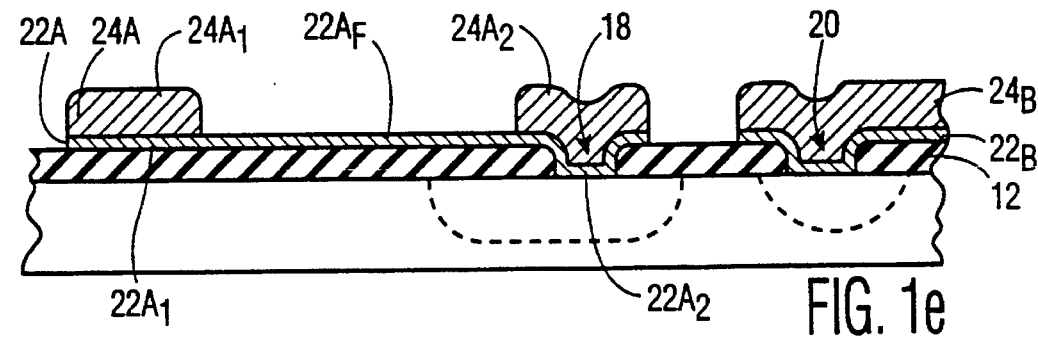
Figure 2B:
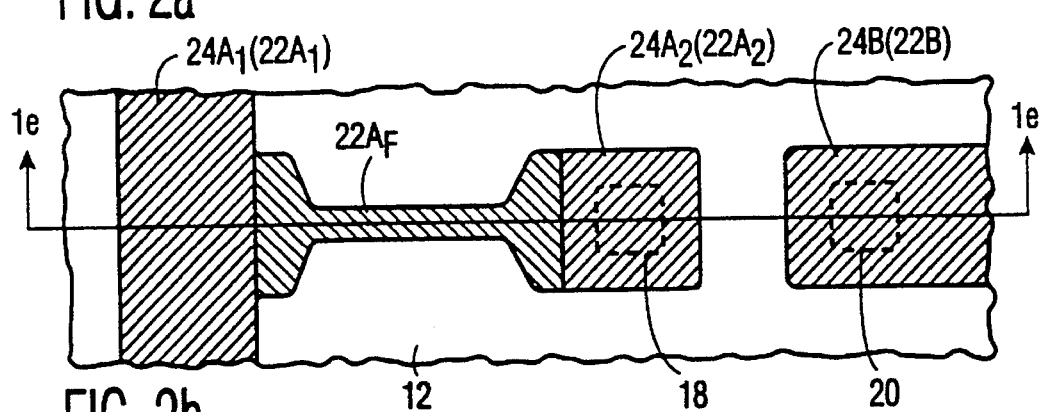

Using another photoresist mask (not shown), primary metal section $24A_F$ is removed with a conventional etchant that does not significantly attack the barrier metal. The etchant typically consists of a solution of nitric, phosphoric, and acetic acids. FIGS. 1e and 2b depict the structure after removal of the photoresist. Barrier metal section $22A_F$ is now exposed. Although primary metal end section $24A_2$ is normally left in place, it could also be removed during this step.

Figure 1F:
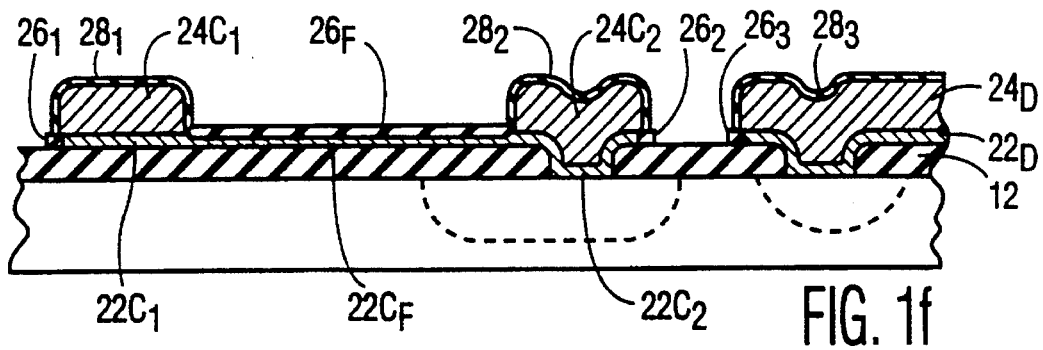
Figure 1G:
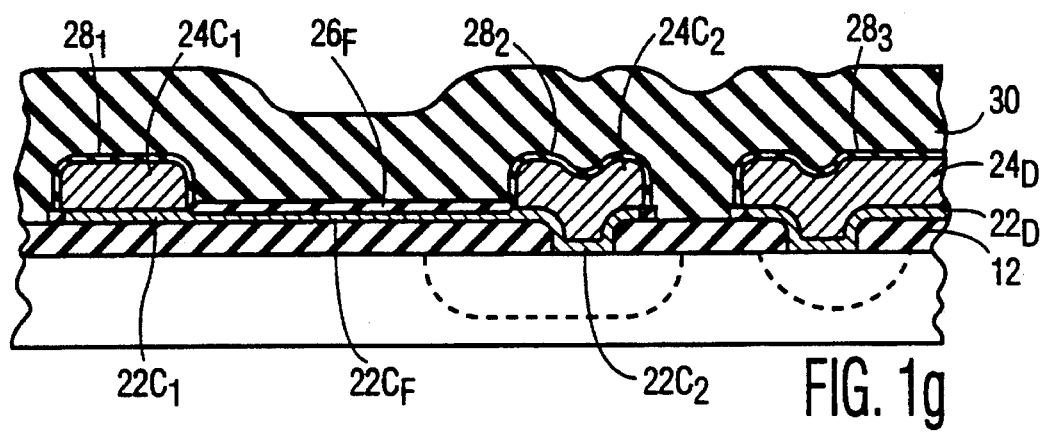
Figure 2C:
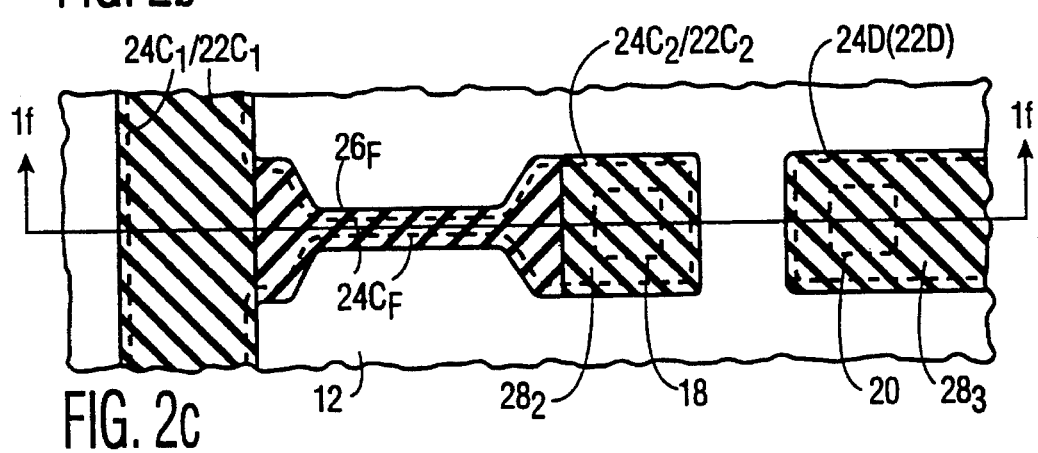

The wafer is placed in a dielectric deposition chamber. Barrier metal oxide is grown along the exposed surface of the patterned barrier metal layer by thermally oxidizing the exposed barrier metal to a prescribed depth so as to make fusible section $22A_F$ thinner (and narrower). FIGS. 1f and 2c show the resulting structure in which item $22C_F$ is the thinned (and narrowed) remaining portion of intermediate section $22A_F$. Item $26_F$ is the layer of barrier metal oxide grown along the exposed surface of section $22A_F$.

During the thermal oxidation, ribbons $26_1$, $26_2$, and $26_3$ of barrier metal oxide grow along the exposed ends of barrier metal parts $22A_1$, $22A_2$, and 22B. Items $22C_1$, $22C_2$, and 22D denote the remainders of barrier metal parts $22A_1$, $22A_2$ and 22B. Also, thin layers $28_1$, $28_2$, and $28_3$ of primary metal oxide grow along the exposed surfaces of primary metal parts $24A_1$, $24A_2$, and 24B. Their remainders, which are denoted as items $24C_1$, $24C_2$, and 24D, form the first interconnect layer. Since the thicknesses of the barrier metal oxide and the primary metal oxide are small and therefore differ little, thick dashed lines are used in FIG. 2c to represent the composite boundaries of adjoining end sections $22C_1$ and $24C_1$, adjoining end sections $22C_2$ and $24C_2$, and adjoining portions 22D and 24D.

The thermal oxidation is performed at a temperature in the range from 300° C. to an upper limit somewhat less than the melting temperature of aluminum. The upper limit is usually about 500° C.

The deposition chamber is typically a conventional chemical vapor deposition reactor operating at a temperature from 350° C. to 500° C. For the preferred barrier metal described above, the oxidation is preferably done at a temperature in the 380° C.–430° C. range. The oxidation time is 0.1–20 minutes, typically 5 minutes. The oxidation is normally performed at atmospheric pressure with oxygen being introduced into the deposition chamber as needed. The resulting thickness of intermediate metal section $22C_F$ is typically 300–700 angstroms.

Alternatively, the deposition chamber could be a plasma enhanced reactor using an oxygen plasma. The oxidation temperature would then be in approximately the 300° C.–450° C. range. Faster oxidation could be achieved by utilizing a temperature nearer the upper limit or by applying more RF power to the plasma.

The primary purpose of the oxidation is to increase the fuse resistance to a value that enables a high programing yield to be achieved without compromising the barrier metal characteristics. In addition, the oxidation can be tailored to compensate for variations in other parameters such as drifts in the dimensions of the photoresist mask used to define the width of intermediate barrier metal section $22A_F$ in FIG. 2a. For example, if section $22A_F$ is too narrow, the oxidation time can be reduced.

Without removing the wafer from the deposition chamber, a second dielectric layer 30 is deposited on the upper surface of the structure as shown in FIG. 1f. In particular, dielectric layer 30 is deposited on barrier metal oxide layer $26_F$, on primary oxide layers $28_1$–$28_3$, and on the uncovered part of dielectric layer 12 at substantially the same temperature as in the preceding thermal oxidation. The deposition is normally done as a continuation of the thermal oxidation by introducing the necessary additional reactants into the deposition chamber.

Dielectric layer 30 preferably consists of silicon dioxide with a small percentage of phosphorus pentoxide formed by the reaction of silane and phosphine. Other gaseous silicon compounds could also be used. The deposition time is 20–40 minutes, typically 30 minutes. Layer 30 reaches an average thickness of 0.7–1.1 microns, typically 0.9±0.1 micron.

Figure 1H:
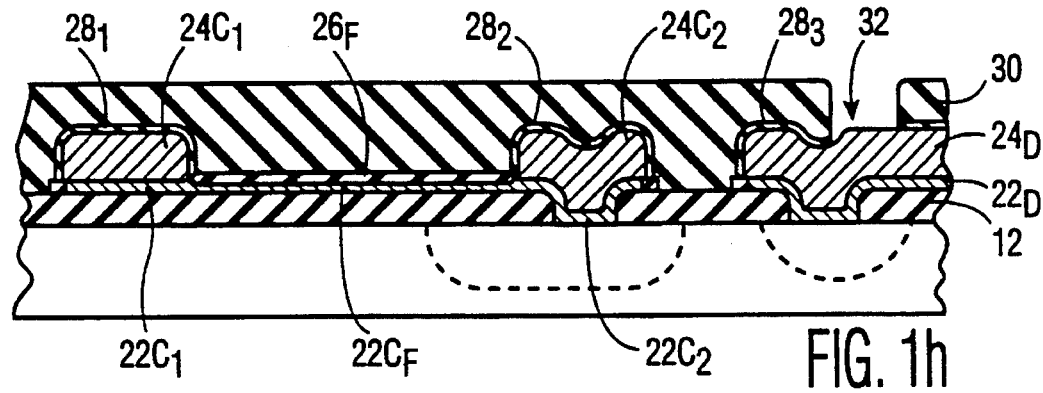
Figure 1I:
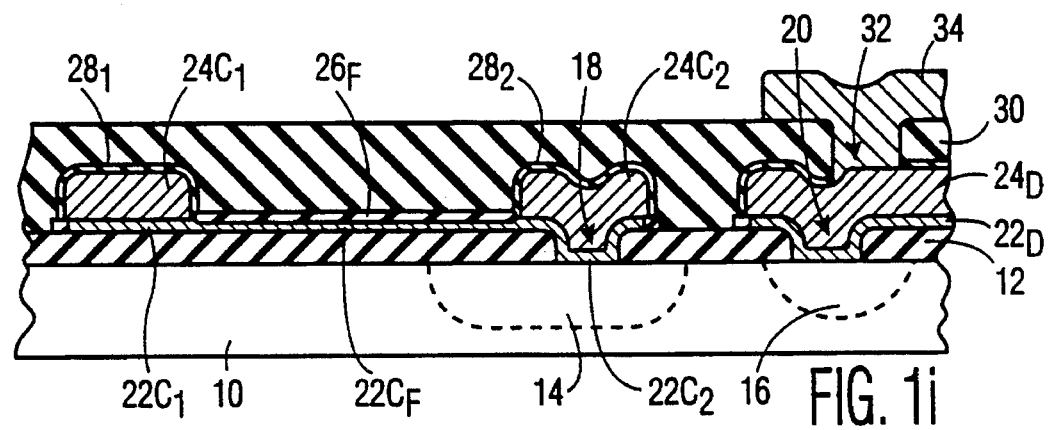

The upper surface of dielectric layer 30 is optionally planarized as indicated in FIG. 1h. The planarization operation can be done in a conventional manner by providing the upper surface of the structure with a further dielectric layer having a largely planar upper surface and then performing an etchback to a specified level. Depending on the initial surface roughness and the amount of the etchback, part of the further dielectric layer may be incorporated into dielectric layer 30.

Using a suitable photoresist mask, an aperture 32 is etched through layer 30 down to primary metal portion 24D. The etch is typically done in two steps, first with a hydrofluoric acid solution and then with a fluorine-containing plasma. In performing the etch, the portion of primary metal oxide layer $28_3$ at the bottom of aperture 32 is also removed. After removing the photoresist, a brief sputter etch is performed to ensure removal of the foregoing part of layer $28_3$.

Figure 2D:
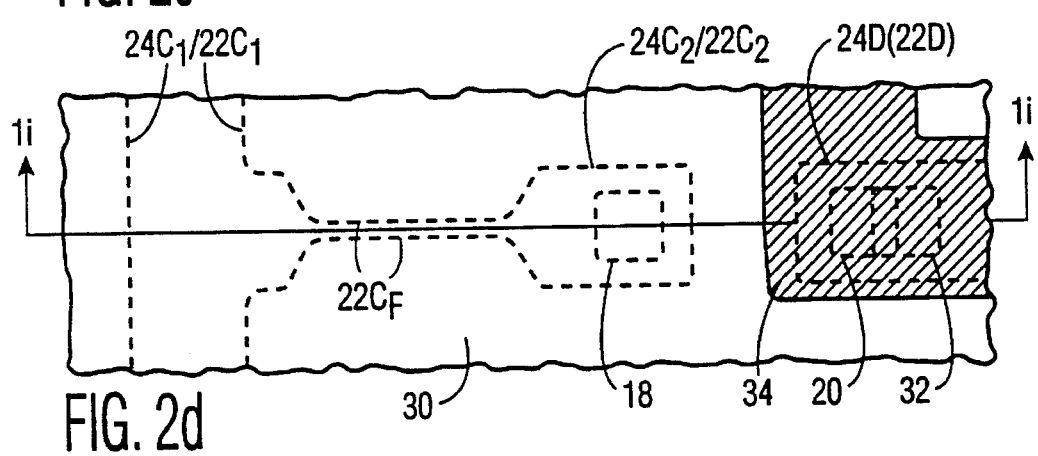

The structure is provided with a patterned further metal layer 34 that serves as a second interconnect layer. Patterned layer 34 is created by depositing a blanket layer of the requisite metal on dielectric layer 30 and into aperture 32 and then etching away the undesired portions of the blanket layer using a suitable photoresist mask. See FIGS. 1i and 2d. Second interconnect layer 34 preferably consists of the same metal as first interconnect layer $24C_1$, $24C_2$, and $24_D$. If layer 34 is the final interconnect layer, its thickness is 1–2 microns. The thickness is 0.5–1 micron if one or more interconnect layers are later formed above layer 34. The structure may now be completed in a conventional manner.

In the final structure, the fuse consists of metal section $22C_F$. The fuse resistance is 50–100 ohms, typically 75 ohms. Fusible link $22C_F$ is programmed by applying a voltage between end sections $22C_1$ and $22C_2$ that is sufficiently high to create an open circuit by melting link $22C_F$. An external programming voltage of 15 volts is typically used for 10 microseconds. The programming voltage is preferably applied to fuse $22C_F$ by way of primary metal section $24C_1$ and silicon region 14. By providing a suitable connection to primary metal section $24C_2$, it could be used in place of silicon portion 14 to program fuse $22C_F$.

Barrier metal portion $22_D$ functions as a diffusion barrier to prevent the silicon in region 16 along aperture 20 from mixing with the primary metal of portion 24D. Barrier metal section $22C_2$ likewise acts as a silicon/aluminum diffusion barrier. Consequently, portions of the same original metal layer 22 serve as a fusible link and as a diffusion barrier.

While the invention has been described with reference to particular embodiments, this description is solely for the purpose of illustration and is not to be construed as limiting the scope of the invention claimed below. For example, other semiconductor materials such as germanium or gallium arsenide could be used instead of silicon. Thin self-aligned metal silicide films could be formed in apertures 18 and 20 prior to the barrier metal deposition. Gold, copper, or an alloy of gold or copper could be used for the interconnect metal. Various modifications and applications may thus be made by those skilled in the art without departing from the true scope and spirit of the invention as defined in the appended claims.

We claim:

1. A semiconductor structure having a programmable fuse comprising:

(a) a semiconductor body, (b) a first dielectric layer disposed on a surface of said semiconductor body, said first dielectric layer having at least one aperture therethrough to said semiconductor body, (c) a barrier metal pattern disposed on a surface of said first dielectric layer opposite to said surface of said semiconductor body, said barrier metal pattern extending through said at least one aperture to said semiconductor body, said barrier metal pattern having at least one first portion of one thickness and a second intermediate portion of a second smaller thickness separate from said at least one aperture, said second portion having reduced dimensions in both lateral and thickness directions, and said barrier metal pattern having an oxide form on at least said second portion to reduce said dimensions of said barrier metal pattern at said second portion to provide a high resistance fuse, (d) a first primary conductive pattern of metal contacting said barrier metal pattern at said at least one aperture, (e) a second dielectric layer on said surface of said first dielectric layer, said second dielectric layer having at least one opening extending therethrough to approximately a position of said at least one aperture, and (f) a second primary metal pattern contacting said first primary metal pattern through said at least one opening.

2. A semiconductor structure according to claim 1, wherein the thickness dimension of said second portion ranges from about 300 Angstroms to about 700 Angstroms.

3. A semiconductor structure according to claim 1, wherein said fuse has a resistance ranging from about 50 ohms to about 100 ohms.

4. A semiconductor structure according to claim 1, wherein said fuse has a resistance of about 75 ohms.

5. A structure according to claim 1, wherein said barrier metal pattern consists of a refractory metal substantially inhibiting semiconductor material of said semiconductor body from mixing with said first primary conductive pattern.

6. A structure according to claim 1, wherein a part of said first portion of said barrier metal pattern extends into said at least one aperture.

7. A structure according to claim 6, wherein another part of said first portion extends into another of said at least one aperture, and wherein said first conductive pattern contacts said another part of said first portion of said barrier metal pattern.

8. A structure according to claim 7, wherein said second primary metal contacts said first conductive pattern through said at least one opening.

* * * * *